United States Patent [19]

Weisenberger

[11] Patent Number: 4,831,270

[45] Date of Patent: May 16, 1989

[54] ION IMPLANTATION APPARATUS

[75] Inventor: Wesley Weisenberger, Mountain View, Calif.

[73] Assignee: Ion Implant Services, Santa Clara, Calif.

[21] Appl. No.: 53,251

[22] Filed: May 21, 1987

[51] Int. Cl.$^4$ .................... G21K 5/00; G01K 1/08; H01J 3/14

[52] U.S. Cl. .................... 250/492.2; 250/398; 250/492.3

[58] Field of Search ............ 250/492.1, 492.2, 492.21, 250/492.3, 396 R, 398, 396 ML, 441.1, 442.1; 315/111.81; 414/217, 225

[56] References Cited

U.S. PATENT DOCUMENTS

| 3,954,191 | 5/1976 | Wittkewer et al. |
|---|---|---|
| 4,008,683 | 2/1977 | Rose . |
| 4,276,477 | 6/1981 | Enge .................... 250/398 |
| 4,346,301 | 8/1982 | Robinson et al. . |
| 4,423,355 | 12/1983 | Kageyama . |
| 4,438,371 | 3/1984 | Hosoki et al. . |
| 4,446,403 | 5/1984 | Cuomo et al. . |
| 4,458,746 | 7/1984 | Holden et al. . |
| 4,498,833 | 2/1985 | Hertel . |
| 4,531,077 | 7/1985 | Dagenhart . |
| 4,553,069 | 11/1985 | Purser . |
| 4,556,823 | 12/1985 | Keller et al. . |
| 4,628,209 | 12/1986 | Wittkower . |
| 4,672,210 | 6/1987 | Armstrong et al. ............. 250/492.2 |

OTHER PUBLICATIONS

MeV Implantation–Model 1500-25, Production Ion Implantation System, General Ionex Corporation Ion. 19 Graf Road, Newburyport, Mass. 0195 This is a cardboard-type flyer of 2 pages with total of 4 sides.

Veeco's High Current Ion Implanter 90% Uptime Guaranteed–There's No Other Warranty Like it in the Industry. Veeco Semiconductor Equipment. Technology and Performance. Veeco Instruments Inc., 1611 Headway Circle, Bldg. #1, Austin, Texas 78754, Cardboard Flyer—4 sides.

Model 80-10 Autoloader Option–Extrion Division Semiconductor Equipment Group Varian. VAC6027 (Printed in U.S.A.), 5/82, Section 15, Extrion Division, Blackburn Industrial Park, Gloucester, MA 01930 (617) 281-2000, cardboard flyer-6 sides.

Model 80-10 High Current Ion Implantation System, by Extrion Division Semiconductor Equipment Group of Varian, Blackburn Industrial Park, Gloucester, MA 01930, Tel. 617/281-200, Cardboard Flyer—8 sides plus 12 pages.

Nissin Electric Co., Ltd., Ion Implantation Systems, by Nissin Electric Co., Ltd., Kyoto, Japan, Cat. No. 1080, printed in Japan, 1986, 5.D.SDA. Nissin Electric Co., Ltd., Head Office and Main Factory; 47 Umezu-Takase-cho, Ukyo-ku, Kyoto 615, Japan, Tel: (075)861-3151, Telex: 541-2106.

(List continued on next page.)

Primary Examiner—Bruce C. Anderson
Assistant Examiner—Michael Aronoff
Attorney, Agent, or Firm—Irell & Manella

[57] ABSTRACT

An ion implantation system includes an ion source generating a horizontally directed ion beam. A quadrupole shapes the beam and a pair of deflector plates deflect the beam downwardly to wafers disposed on a horizontally disposed wheel. The beam is shifted radially relative to the wheel by a deflector plate carrier apparatus. This apparatus includes a stepper motor controlled driver magnet disposed externally of a beam/wheel evacuated enclosure. A driven magnet disposed in the enclosure is joined to the deflector plates all of which ride on linear bearings. Movement of the driving magnet moves the driven magnet, and therefore, the deflector plates and beam. An evacuatable transport is used to transport wafers in cassettes on or wafer mounting plates in a vacuum. A robot arm in the wheel enclosure retrieves wafers from a cassette in the transporter through adjoining sealable ports for placement on and removal from wafer support plates on the wheel. Alternatively, two independently rotatable wheels may be provided with beam impingement regions of both accessible from above. One wheel may then be loaded and unloaded while wafers on the other are being implanted.

29 Claims, 6 Drawing Sheets

OTHER PUBLICATIONS

Model 80-10 Predeposition Ion Implantation System, by Extrion Division, Blackburn Industrial Park, Gloucester, MA 01930, Cardboard Flyer, printed in U.S.A. 9/80, Section 15, VAC 6013C.

Precision Implant 9000, by Applied Materials (Quality Starts Here), 3050 Bowers Avenue, Santa Clara, CA 95054, Applied Materials, Inc. 1985, All Rights Reserved. Light Touch® of Applied Materials, Inc., printed in U.S.A. 419, 8/85, 10K, brochure of 20 pages.

Ion Implantation Equipment & Techniques, Proceedings of the Fifth Int'l Conf. on Ion Implantation Equipment & Techniques, Smugglers' Notch, Jeffersonville, VT, USA, Jul. 23-27, 1984, Editors: J. F. Ziegler, IBM-Research, Yorktown, NY 10598, R. L. Brown, IBM-GTD, Essex Junction, VT 05452, USA, North-Holland-Amsterdam, 1 page.

Peter H. Rose of Eaton Corporation. A History of Commercial Implantation, Section I. Ion Implantation Systems. Nuclear Instruments & Methods in Physics Research B6 (1985), 1-8 North-Holland, Amsterdam . . . 0168-583X/85/$03.30 copyrt. Elseiver Science Publishers B.V. (North-Holland Physics Publishing Division)-8 pages.

Michael I. Current of Xerox-Palo Alto Research Center, CA, Current Status of Ion Implantation Equipment and Techniques for Semiconductor IC Fabrication, Nuclear Instruments and Methods in Physics Research B6 (1985), 9-15 North-Holland, Amsterdam . . . 0168-583X/85/$03.30, Elsevier Science Publishers B.V.

Peter H. Rose, Ronald Faretra and Geoffrey Ryding of Eaton Corp., Semiconductor Equip. Opt'ns. MA, USA, A High-Energy, High-Current Ion Implantation System-7 pages.

Nuclear Instruments and Methods in Physics Research B6 (1985) 17-34, 0168-583X/85/$03.30, Elsevier Science Publishers B.V. (North-Holland Phys)-8 pages.

K. Matsuda, T. Kawai, M. Naitoh and M. Aoki of Nissin Electric Co., Ltd., Japan, A High Current Ion Implanter Machine, Nuclear Instruments and Methods in Physics Research B6 (1985), 35-38 North-Holland, Amsterdam . . . 0168-583X/85/$03.3, Elsevier Science Publishers B.V. (North-Holland Physics Publishing Div)-4 pages.

Ollie Woodard, Paul Lindsey, Joseph Cecil and Robert Pipe of Veeco Instrument, P.O. Box 17068, Austin, TX 78760, USA . . . Section III. Ion Implanter Control and Diagnostics. Computer Automation of High Current Ion Implanters . . . Nuclear Instruments & Methods, etc. . . . 0168-583X/85/$ 03.30 Elsevier Sci-Publ.-8 pages.

Wesley H. Weisenberger and Michael McCullough of Ion Implant Services, Santa-Clara, CA 95054, USA. Section IV. Ion Implanter Components and End Stations, Particle Generation in Medium Current, Current Implanters in NIMPR B6 (1985), 0168-583X/85/$03.30, Elsevier Science Publishers B.V. (North-Holland Phys.)-6 pages.

J. Pollack, N. Turner, R. Milgate, R. Resnek and R. Hertel of Varian/Extrion, Blackburn Industrial Park, Gloucester, MA 01930, USA, Particulate Performance of a Wafer Handle for Serial Process Ion Implantation in NIMPR B6 (1985), 0168-583X/85/$03.30, Elsevier Science Publishers B.V. (North-Holland Phys.)-8 pages.

A. J. Armini and S. N. Bunker of Spire Corp., Patriots Park, Bedford, MA 01730, A High Throughput Metal Ion Implanter End Station, NIMPR B6 (1985), 214-218, North-Holland, Amsterdam . . . 0168-583X/85/$03.30, Elsevier Science Publishers B.V. (North-Holland Physics Publishing Div.)-5 pages.

N. Turner of Varian/Extrion Div., Gloucester, MA 01930, USA, Uniform Implantation with Electrostatic Scanning Using a Target Repositioning Technique, NIMPR B6 (1985), 224-227 North-Holland, Amsterdam . . . 0168-583X/85/$03.30, Elsevier Science Publishers B.V. (North-Holland Physics Publ.)-4 pages.

Charles Ehrlich, Adrian Delforge and Reuel Liebert of Varian/Extrion Div., Gloucester, MA 01930, USA, A Technique for Optimizing the Dose Uniformity of a Magnetic Scanning High Current Implanter, in NIMPR B6 (1985), 228-236, 0168-583X/85/$03.30, Elsevier Science Publishers, B.V. (North-Holland . . . )-9 pages.

J. F. Ziegler, of IBM Research, Yorktown Heights, New York, 10598, USA, Section V. Semiconductors: (a) High Energy Implantation-High Energy Ion Implantation, NIMPR B6 (1985), 270-282, North-Holland, Amsterdam 0168-583X/85/$03.30, Elsevier Science Publ. B.V. (North-Holland Publ.)-13 pages.

A Basic Course in General Ion Implantation Equipment, Training Manual, vol. VII, ETN Semiconductor Equipment; Eaton Corp., Ion Beam Systems Division, 2433 Rutland Dr., Austin-Texas 78758, Jan. 1984, total of 125 pages.

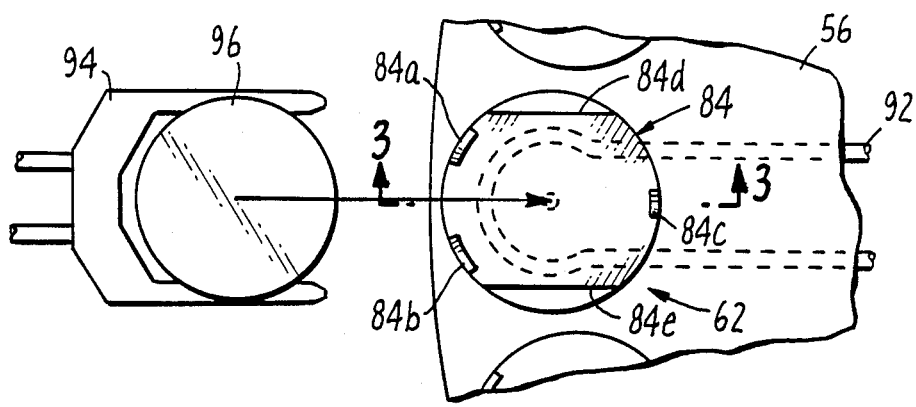
FIG. 2.
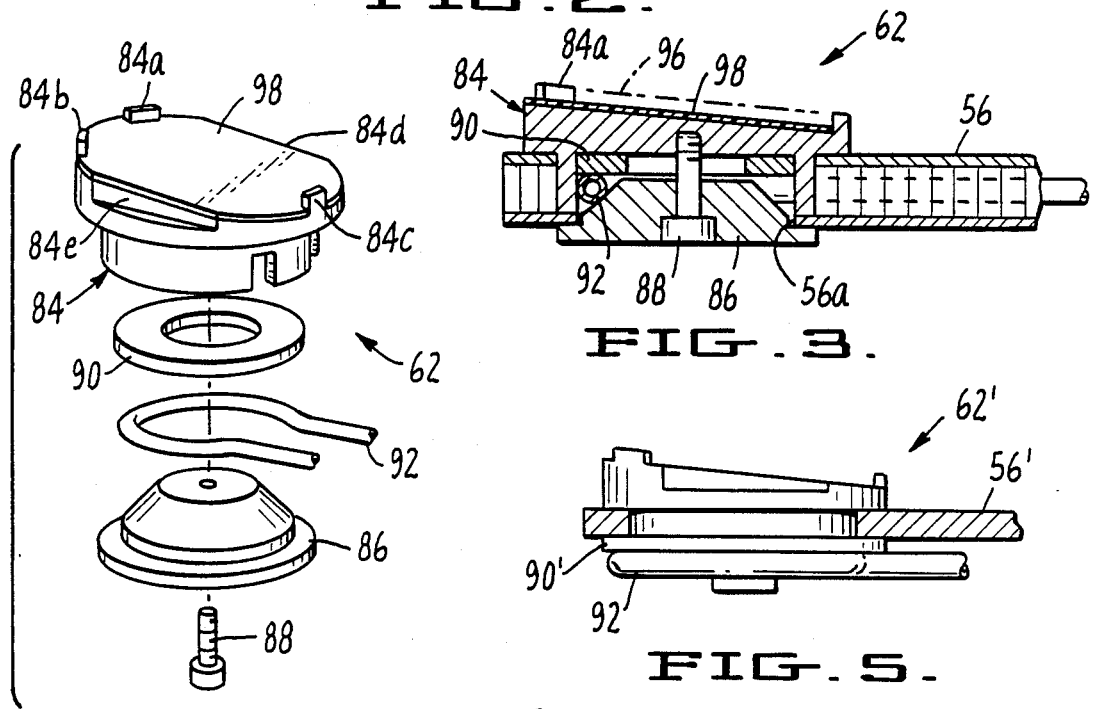
FIG. 3.
FIG. 4.
FIG. 5.
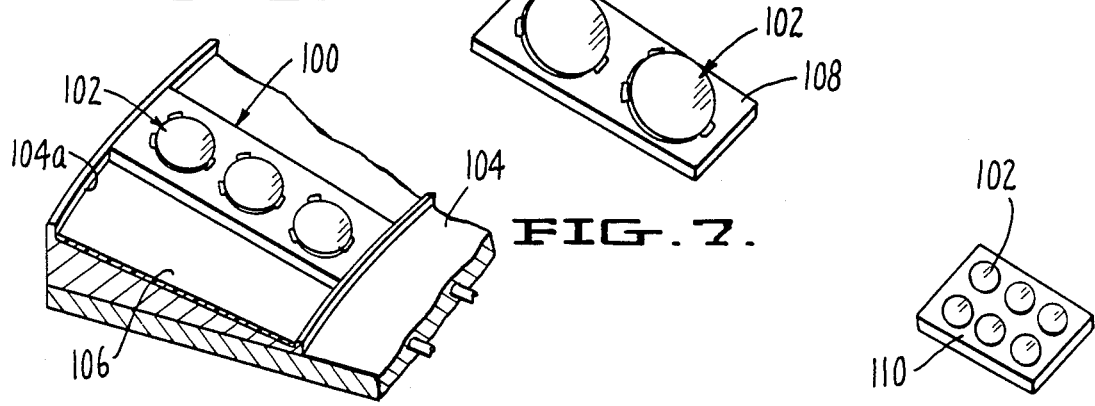
FIG. 6.
FIG. 7.
FIG. 8.

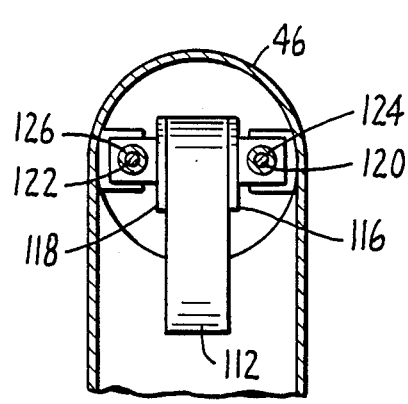
FIG.11.
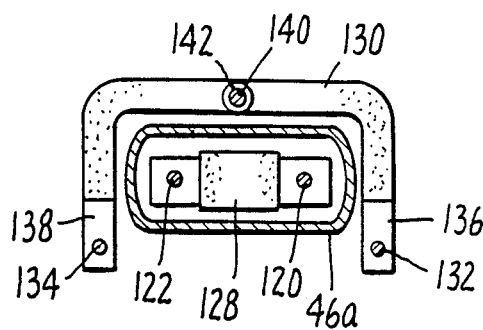
FIG.12.
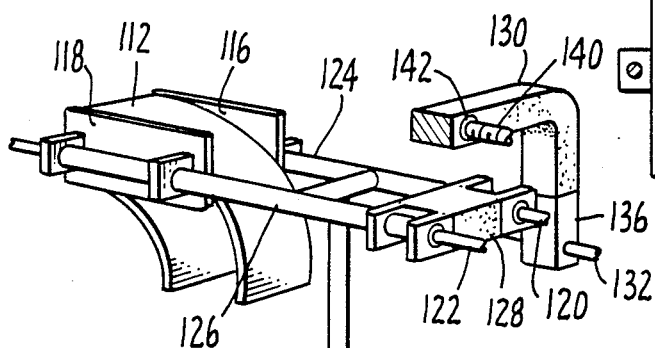
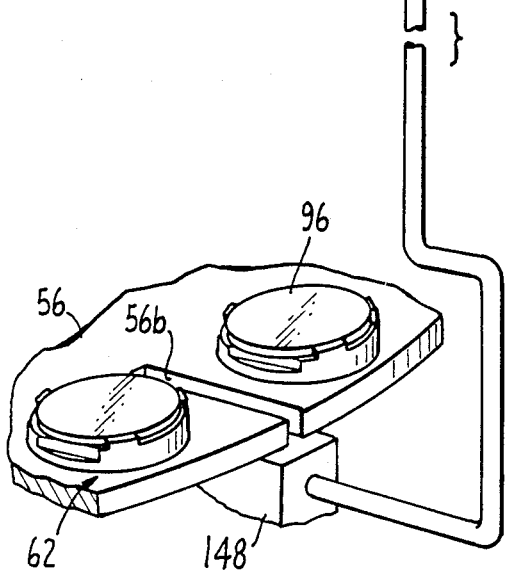
FIG.13.
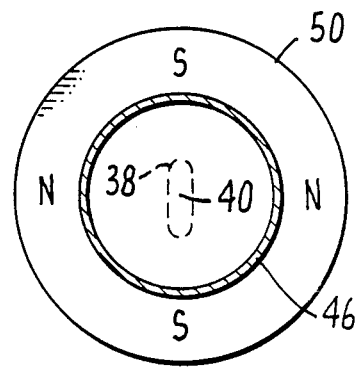
FIG.14.
FIG.15.

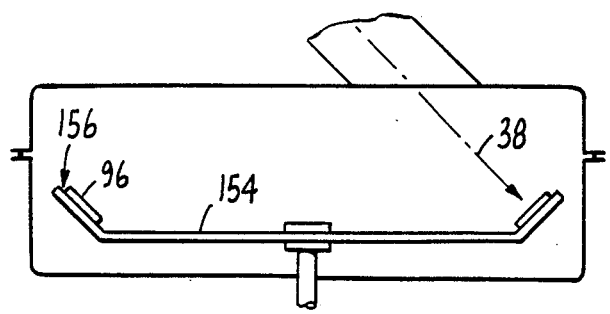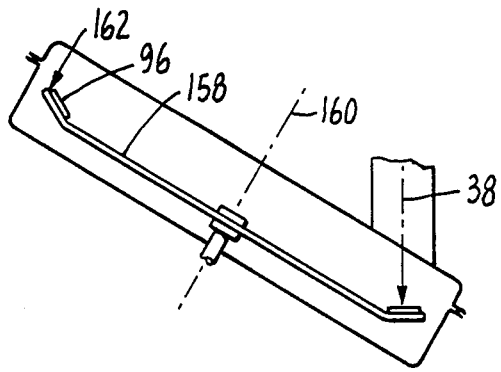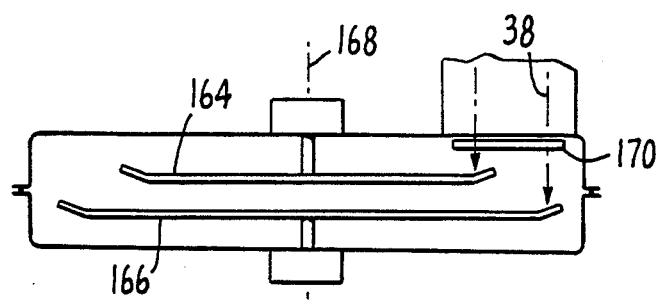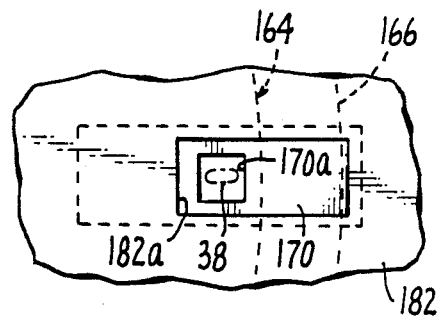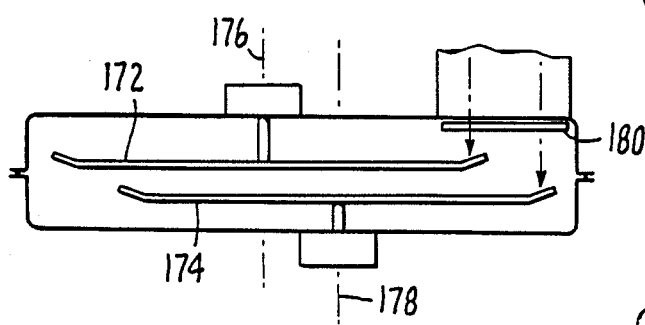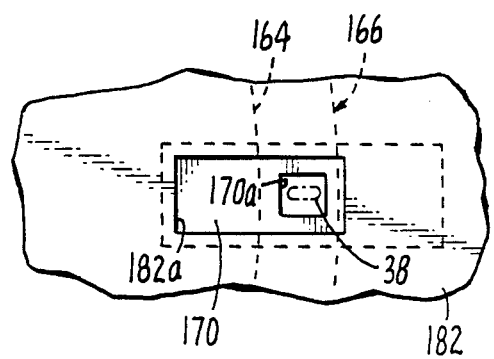

ION IMPLANTATION APPARATUS

TECHNICAL FIELD

This invention relates generally to the field of ion implantation, and more particularly relates to an improved high current, high throughput ion implantation apparatus.

BACKGROUND

Ion implantation involves the introduction of impurities into a solid workpiece by directing an energetic beam of particles at the workpiece surface. When sufficiently energetic ions are used, the ions penetrate the workpiece surface and impregnate the near-surface region of the solid. Generally, the advantages of "doping" solids using ion implantation, over prior art methods such as high temperature diffusion or impregnation during crystalline growth, are (1) precise control over the type and amount (or "dosage") of impurity introduced and (2) precise control over the depth and uniformity of the impurity distribution.

While a number of scientific and engineering applications of ion implantation are known, a fairly recent and major application relates to the area of semiconductor device manufacture, where ion implantation has become a relatively standard doping technique in the fabrication of diodes, MOS transistors, resistors and the like. Typically, silicon is doped with boron, phosphorus or arsenic dopant ions having an energy of between about 3 and about 500 keV, yielding an implantation depth of about 100 to 10,000 Angstroms. Such a process thus places the implanted ions well below the surface, the depth of implantation being roughly proportional to the ionic energy. Upon annealing (heating to temperatures on the order of about 600 to 1000 degrees Centigrade), dopant concentrations of about $10^{14}$ to $10^{21}$ atoms per cubic centimeter are obtained.

A typical ion implantation apparatus includes at one end a gaseous source of appropriate material such as $BF_3$ or $AsH_3$, a means for controlling the flow of gas to an ion source, e.g. an adjustable valve, and a high voltage power supply which energizes the ion source so as to create a plasma therein, at pressures generally of about $10^{-3}$ torr. As the plasma is formed, the ions contained in the plasma are continuously extracted and accelerated through a voltage of about 10,000 to about 50,000 V. An analyzer magnet selects the ionic species of interest, which as a beam is then passed through a vacuum to the target. Examples of ion implantation devices known in the art include those disclosed in U.S. Pat. Nos. 4,008,683 to Rose; 4,346,301 to Robinson et al.; 4,498,833 to Hertel; and 4,628,209 to Wittkower.

U.S. Pat. No. 4,628,209 to Wittkower, for example, describes an ion implantation apparatus for doping a plurality of semiconductor wafers, wherein the wafers are supported on a rapidly rotating wheel and implanted by an ion beam which scans repeatedly over the wafer surfaces. The Wittkower invention includes an on-line method of monitoring the beam profile and thus improves one's control over the uniformity and dose of implantation.

The ion implantation devices of the prior art, though, still present several problems. First, metal oxides—e.g., gate oxides—on the semiconductor surface may be undesirably degraded by charge build-up during implantation. Second, as ion implantation technology has advanced, there has been an increasing and as yet unsatisfied demand for lower charge and particle build up, as well as for more precise control over uniformity and dose of implant as well as for improved surface smoothness.

A further problem with conventional implantation systems is the limited throughput which is achievable with them. That is, large volumes are not generally attainable. Most systems use some form of wheel on which to mount the semiconductor wafers. Normally these wheels are positioned in a horizontal plane for loading and then raised to a vertical position for implantation. The size of these wheels and the associated equipment is therefore necessarily limited by the amount of typical floor-to-ceiling space commercially available, which is usually eight to ten feet. Known exceptions to this are a system which mounts the wafers on the side of a rotating cylinder, as described in U.S. Pat. No. 4,346,301; and a system which uses a horizontal wheel and impinges the wafers from below, as described in "Computer Automation of High Current Ion Implanters", by Woodard et al., *Nuclear Instruments and Methods in Physices Research*, B6 (1985), pp. 146–153. These systems all require, during at least some stage of the wafer implantation process, that the wafers be mechanically clipped or otherwise held on a wafer support plate. Such contact with the wafer produces atmospheric pollutants, some of which inevitably end up on the wafers as unwanted particles.

Particle build up also results from handling and manipulating the wafers prior to loading onto and unloading off of a wafer-support wheel in nonvacuum conditions. Typically, wafers are provided to a transfer station in a carrier cassette in a clean-room environment in which people and other equipment are located. There is thus substantial opportunity for surface particle transfer and contamination of the wafers.

SUMMARY OF THE INVENTION

The present invention provides an ion implantation system which overcomes many of these disadvantages of the prior art. More particularly, it provides a system which permits the treatment of a large number of wafers at a time. It does so in a way which increases the rate of wafer throughput without encountering damaging charge buildup problems. This is preferably provided by presenting the wafers generally horizontally to an ion beam which is directed at them from above. Further, in one aspect of the invention means are provided for varying the beam across an impingement region which is controlled from externally of an evacuated enclosure surrounding the beam transmission path.

The present invention also provides a system wherein the wafers are handled during transit to the implantation enclosure, as well as during loading, unloading, and implantation in a near vacuum environment which minimizes the number of free particles to which the wafers are subject.

The present invention also preferably provides an ion implantation system generally having means for generating an implantation ion beam directed along a beam transmission path along an initial beam axis; target support means for supporting a target element or wafer spaced from the initial beam axis during ion implantation; beam diversion means disposed relative to the beam transmission path for diverting a beam generated by the generating means from the initial beam axis toward a beam impingement region of the target support means, the diversion means being mounted relative to the generating means for movement along the initial beam axis; and means for moving the diverted beam across the target support means both laterally of and in line with the first impingement line, whereby a target material supported on the target support means is scanned within the beam impingement region.

The target support means is preferably in the form of a generally horizontally disposed wheel on which the target elements are supported. The initial beam axis is generally horizontal so that the beam is diverted or deflected in a downward direction into the impingement region. Further, the diverted beam is preferably shaped to be elongate in line with the initial beam axis and that the beam is moved relative to the impingement region in line with the initial beam axis by physically moving the diversion means along the initial beam axis. This latter feature is provided by magnetically coupling a driven carrier external of an enclosure containing the diversion means to the diversion means disposed in the enclosure.

Another preferred feature of the present invention is a housing which includes an evacuatable chamber for transporting the target elements to and from the evacuated enclosure. It includes a transfer port sealingly engageable with an entry port on the implantation enclosure for loading and unloading the target elements from the target stations.

It can be seen that such a system provides the advantages described above. Most importantly, it provides a system which can be sized to have increased throughput which results in fewer surface particles and less wafer contamination than other known systems. These and other features and advantages of the invention will become apparent from a consideration of the drawings and the following detailed description of the preferred embodiments.

BRIEF DESCRIPTION OF THE DRAWINGS

FIG. 2 is a fragmentary top view of the loading unloading apparatus of the system of FIG. 1.

FIG. 3 is a cross-section taken along line 3—3 in FIG. 2.

FIG. 4 is an exploded view of a wafer support station shown in FIG. 2.

FIG. 5 is a cross-section view similar to FIG. 3 showing a wafer support station mounted on an alternative structure.

FIGS. 6, 7 and 8 are perspective views of alternative embodiments of wafer support stations.

FIG. 11 is a cross-section taken along line 11—11 in FIG. 9.

FIG. 12 is a cross-section taken along line 12—12 in FIG. 9.

FIG. 13 is a simplified partial fragmentary, perspective view of an alternative embodiment of the apparatus shown in FIG. 9.

FIG. 14 is similar to FIG. 11 showing an alternative deflector embodiment.

FIG. 15 is an end view of the quadrupole of FIG. 1.

FIGS. 16 and 17 show alternative wafer support wheel orientations.

FIGS. 18 and 19 show alternative arrangements for plural wafer support wheels.

FIGS. 20 and 21 show a movable aperture usable with the embodiments shown in FIGS. 18 and 19.

DETAILED DESCRIPTION OF THE PREFERRED EMBODIMENTS

Figure 1:
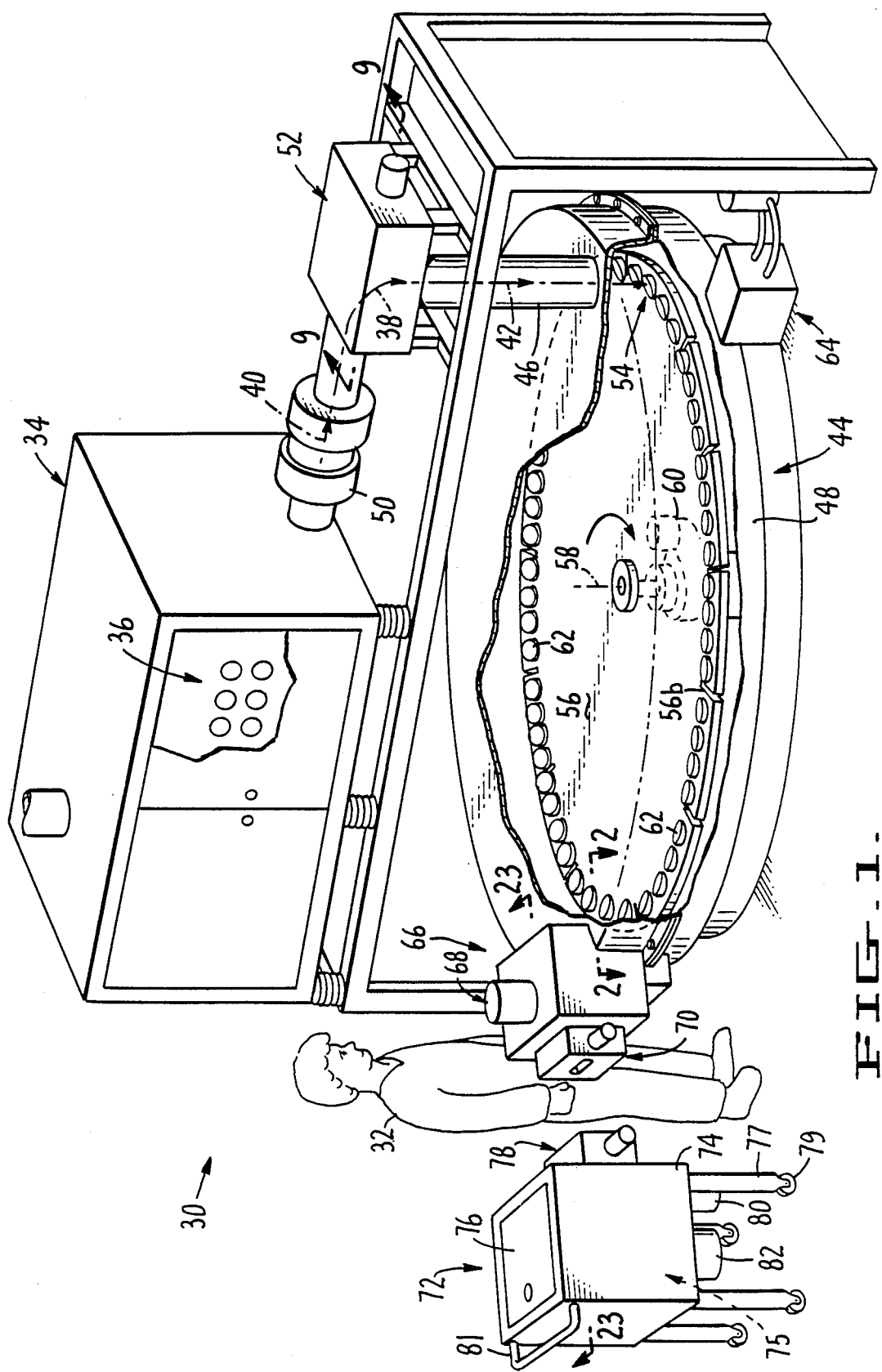
FIG. 1 is a perspective view of an ion implantation system made according to the present invention.
Figure 10:
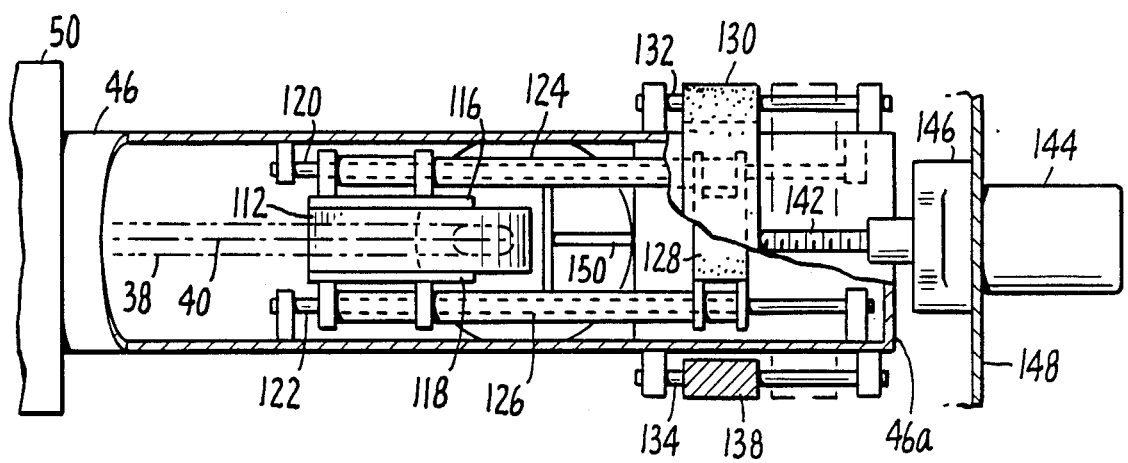
FIG. 10 is a cross-section taken along line 10—10 in FIG. 9.

Referring initially to FIG. 1, an ion implantation system made according to the present invention is shown generally at 30. System 30 is operable by an operator 32 who is responsible for remotely coordinating the loading, unloading and implantation procedures via a control panel (not shown) built into a cabinet 34. Cabinet 34 also houses an ion beam generator, shown generally at 36, which is made conventionally to include an appropriate power supply, evacuator, gas supply, ion source, analyzers and beam accelerators. An ion beam 38 is produced which initially travels horizontally along an initial beam axis 40 defined by the initial portion of a beam transmission path 42. Path 42 is enclosed in an evacution enclosure 44 which is evacuated to approximately $10^{-3}$ torr. Enclosure 44 includes a beam path portion 46 and a wheel enclosure portion 48.

After exiting beam generator 36, the beam passes through a quadrupole 50 which shapes the beam. A schematic end view of the quadrupole is shown in FIG. 15 which shows the generally preferred shape of the beam as it exits the quadrupole. As will be seen the vertically elongate beam shown in this figure results in the beam impinging a wafer with the elongate dimension generally normal to the faster scan movement (wheel rotation) associated with the scanning of the beam on a wafer during implantation.

The present invention also provides means for diverting the beam toward a beam impingement region. In the preferred embodiment, this is provided by a deflector assembly shown generally at 52. Assembly 52 provides for deflecting beam 40 downwardly through the remainder of enclosure portion 46 and into a beam impingement region 54 in enclosure portion 48 in which is disposed a rotatable wheel 56 driven about a vertical axis of rotation 58 by a motor 60. Wheel 58 has a generally circular periphery around which are disposed what may be considered a plurality of target stations or wafer holders 62. Each wafer holder is cooled by a coolant provided by a coolant system 64.

Disposed away from beam impingement region 54 is a wafer transfer station 66. Station 66 includes a robot 68 for manipulating the wafers and an entry port 70 through which wafers are loaded into and removed from enclosure 44. Wafers are preferably transported to and from transfer station 66 via an evacuatable transporter 72. Transporter 72 includes a housing 74 defining a wafer storage chamber 75 and having a large upper door 76 for providing access appropriate for inserting and removing wafer-carrying cassettes and a transfer port 78 sealingly engageable with port 70 for providing robot 68 with an evacuated external chamber from which unimplanted wafers are provided and to which implanted wafers are returned. Transporter 72 also includes an evacuating pump 80 for evacuating chamber 75 and a cassette manipulating unit 82 used to selectively position cassettes adjacent port 78 for removal or loading of wafers. Housing 74 is mounted on legs 77 having wheels 79 which allow it to be easily moved around when not attached to enclosure 48. A handle 81 attached to the housing provides a grip for operator 32 to more easily reposition the unit.

Referring now to FIGS. 2-4 , wafer holders 62 are shown in further detail. Each holder 62 includes a wafer support plate 84 having a plurality of upstanding projections around its periphery including outer projections 84a and 84b, and inner projection 84c. These projections are positioned to allow a wafer to nest between them while retaining the wafer in a fixed position. It will be observed, particularly as viewed in FIG. 3, that plate 84 is inclined upwardly outwardly so that the wafers face slightly inwardly toward the center of rotation of wheel 56.

Plate 84 is secured in position on wheel 56 by sandwiching the wheel between plate 84 and a base plate 86 fastened to plate 84 by a mounting bolt 88 which extends through an aperture 56a in the wheel. Sandwiched between the plates is a heat conducting washer 90, preferably made of indium, and a coolant tube 92. Plate 84 has notches 84d and 84e which extend across opposite side margins of the plate generally radially relative to wheel 56. These notches provide space for the prongs of a wafer-lifting fork 94 which, as will be described further, forms the end effector of an arm of robot 68. A wafer 96 is shown being carried by fork 94 in FIG. 2 in a position just prior to loading on support plate 84. The top face of plate 84 preferably has adhered to it a layer 98 of a rubber conductive material which provides a resilient mat for the wafer to rest on without disturbing surface particles or generating contaminants and yet which conducts heat away from the wafer. There also are spring-loaded pins (not shown) which extend through holes in the rubber mat and contact the under side of the wafer to conduct charge build up away from the wafer.

FIG. 3 shows holder 62 being mounted on a relatively light but structurally rigid wheel 56 made of a conventional laminated hexagonal honeycomb-like cellular structure. FIG. 5 shows a similar wafer holder 62' mounted on a solid plate wheel 56'. It includes coolant tube 92 and a heat conducting washer 90'.

FIGS. 6-8 show alternative embodiments for wafer holder 62. In FIG. 6 a carrier plate 100 is shown having three wafer support surfaces 102 structured like the upper surface of plate 84. Carrier plate 100 rests in a channel 104a of a support wheel 104, which channel is slightly slanted to conform with the slant on plate 84. Disposed in channel 104a is a rubber mat 106 similar in material to mat 98 which is also disposed on faces 102.

FIG. 7 shows a similar carrier plate 108 having two support surfaces 102. FIG. 8 shows an embodiment in which two columns of three surfaces 102 each are on a carrier plate 110. In each of the embodiments shown in FIGS. 6-8 , it is presumed that suitable means are provided for robot fork 94 or other equivalent end effector is able to support and carry the carrier plates, such as by bores (not shown) extending radially into the outer sides for cantilevered support. Further, transporter 72 also could readily be structured to store the entire carrier plate units with wafers previously loaded on them to provide for an implantation process without any actual separate movement or handling of individual wafers. This provides a particular advantage of processing wafers without exposing the back sides of the wafers, which tend to be dirty in the sense of having loose particles. When the wafer container is evacuated, some of these particles can be dislodged and end up on the top or front side of the same or other wafers.

Figure 9:
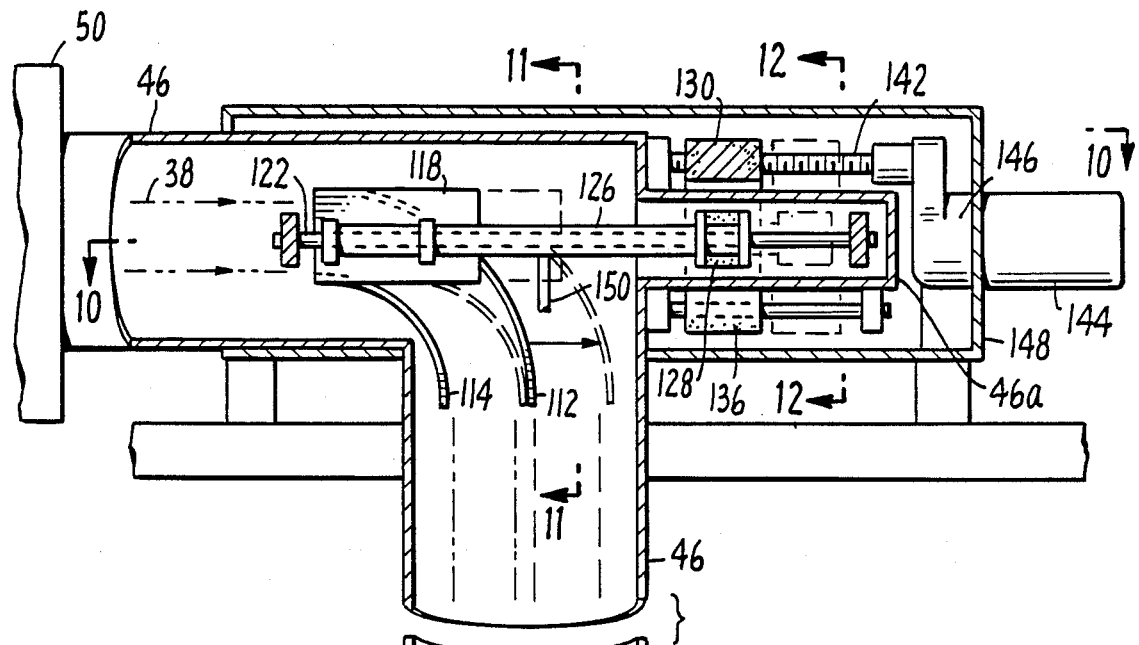
FIG. 9 is a cross-section taken along line 9—9 in FIG. 1.

Deflector assembly 52 is more clearly shown in FIGS. 9-12. FIG. 9 is a side cross-section of the assembly. Assembly 52 includes a pair of electrostatic deflector plates 112 and 114 which are appropriately connected to suitable voltages to deflect beam 38 90 degrees to the downward vertical direction shown. Plates 112 and 114 are fastened at both sides to support plates 116 and 118. The support plates are then mounted for sliding relative to two parallel inner guide rods 120 and 122 by sleeves 124 and 126 which are slidingly mounted on the guide rods. The guide rods are fixedly mounted at opposite ends to enclosure portion 46 which is rigidly constructed. The rods extend into an enclosure extension 46a which extends in the direction of initial beam travel beyond the downwardly extending vertical portion.

Mounted to and extending between sleeves 124 and 126 is a driven magnet 128. Mounted externally of enclosure 46 and adjacent magnet 128 is a driving magnet 130 extending partially around the enclosure and mounted at opposite ends to outer guide rods 132 and 134 via sliding bearings 136 and 138. Disposed in a bore in the upper center of magnet 130 a threaded sleeve 140. Matingly threaded into sleeve 140 is a drive screw 142 which is rotatingly driven by a stepping motor 144 via gearing assembly 146. Motor 144 and assembly 146 are mounted onto a deflector assembly housing 148.

When screw 142 rotates, magnet 130 moves along axis 40. Magnet 128 is magnetically coupled to magnet 130 so that it is pulled along with magnet 130 to travel along rods 120 and 122 as is represented by the phantom lines in the figures. Thus ion beam 38 is shifted between left and right as viewed in FIGS. 9 and 10 by the controlled movement of driving magnet 130.

As shown in FIG. 1, interposed selected ones of the wafer holders (approximately every fourth one) there is a slot 56b which extends through wheel 56. This allows the ion beam to pass through the wheel periodically to a sensor 148, such as a conventional Faraday cup, for measuring the beam impinging the wafers. In order to minimize the size of the sensor it preferably is supported on a carriage 150 connected to sleeves 124 and 126 which carry deflector plates 112 and 114. Thus the sensor is maintained in a position to be impinged by the beam as it passes through a slot 56b. This is particularly shown in FIGS. 9 and 13.

FIG. 14 shows an alternative embodiment which could be used in place of electrostatic deflector plates 112 and 114 to divert the ion beam. This is in the form of a large magnet 152 shown without coils and related structure for simplicity. In this embodiment the beam is also deflected without having a mechanical member passing through enclosure 46. In such an embodiment it is necessary to have a remotely controlled traveling sensor, sensors placed at staggered positions under the wheel, or a sensor shifted by the magnetically coupled drive shown in FIGS. 9 and 10 for moving the sensor.

FIGS. 16 and 17 illustrate two alternative orientations for the wheel and angle of beam impingement. In FIG. 16, a wheel 154 is shown having margins which are angled upward and inward at a selected angle. This allows for the use of wafer holders 156 which have top surfaces parallel with the adjacent wheel surface relative to which they are mounted. When a beam to wafer impingement angle of about 90 degrees is desired, the beam is directed at an angle transverse to the vertical, as shown.

FIG. 17 illustrates an orientation wherein a wheel 158, similar to wheel 154, is mounted for rotation about an axis 160 which is transverse to the vertical and the beam is directed generally vertically downwardly toward the holder 162. In essence, this is the same as the embodiment of FIG. 16 tilted to make the beam direction vertical. In both embodiments no clipping of the wafers onto the wafer holders is required as gravitational and centrifugal forces maintain them in position, as is the case with the embodiment shown in FIG. 1.

FIGS. 18 and 19 illustrate a large throughput configuration wherein two independently rotatable wheels are used. One wheel can be implanted while the other one is being loaded. In FIG. 18 an upper wheel 164 and a larger diameter lower wheel 166 rotate about a common axis 168. The beam is shiftable to impinge wafers supported by each wheel. The beam is preferably prevented from potentially impinging the inappropriate wheel by a movable shield 170 which will shortly be described with reference to FIGS. 20 and 21.

FIG. 19 illustrates and arrangement where upper and lower wheels 172 and 174 are of the same diameter but rotate about axes 176 and 178, respectively, which are horizontally displaced from each other. In this arrangement a movable shield 180 similar to shield 170 is used to isolate the nonimplanting wheel from the beam. The two wheels are sufficiently offset so that the beam may be moved to impinge the wafers supported on one or the other of the wheels.

Referring now to FIGS. 20 and 21, movable shield 170 is shown. These figures show a top view of shield 170 being mounted for sliding movement between left and right limits under a mounting plate 182 having a rectangular aperture 182a which defines the maximum beam impingement region. This region is further limited by the actual travel path of shield 170 which has a smaller aperture 170a shiftable between a location over wheel 164, as shown in FIG. 20, and a location over wheel 166, as shown in FIG. 21.

Figure 23:
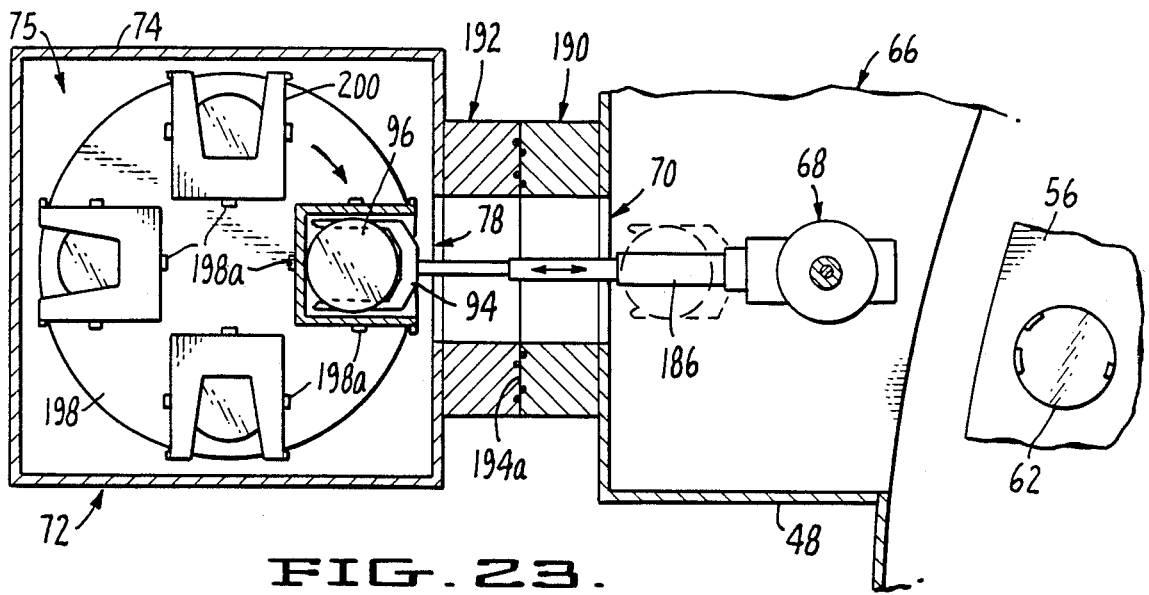
FIG. 23 shows a cross-section taken along line 23—23 in FIG. 22.
Figure 22:
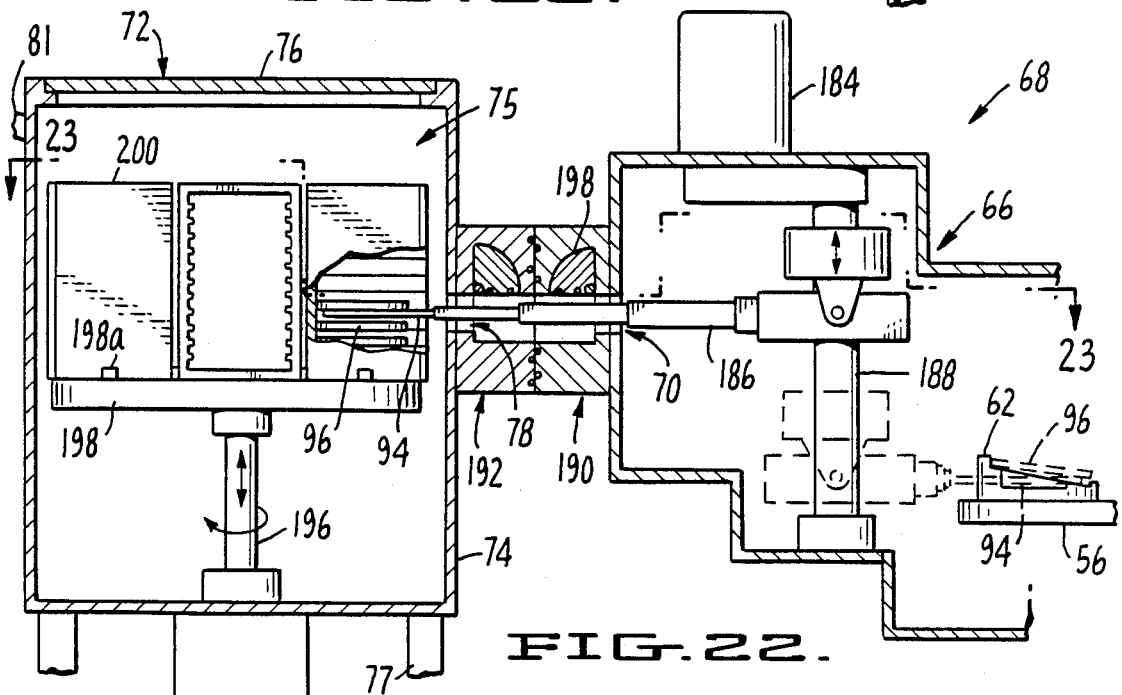
FIG. 22 shows a cross-section taken along line 22—22 in FIG. 1 with the wafer transporter coupled to the implantation enclosure.
Figure 24:
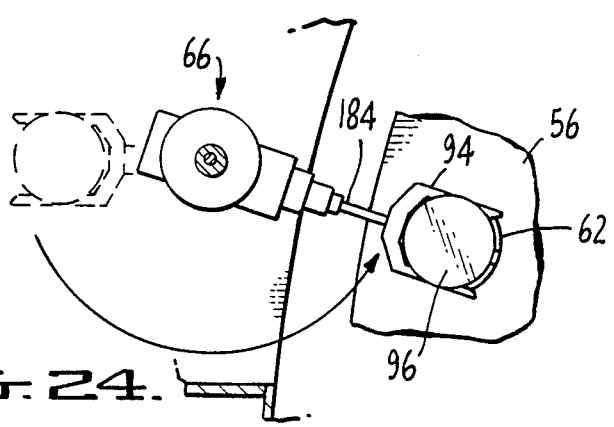
FIG. 24 shows a top view of the robot arm used to transfer wafers between the transporter and the wafer support wheel.

In FIGS. 22-24, the apparatus for loading and unloading wafers from wheel 56 is shown. In particular transfer station 66 and transporter 72 are shown. The transfer station includes robot 68 which is driven by a power unit 184. A manipulator arm 186 is controlled on a vertical shaft 188. The arm extends from shaft 188 to end effector or fork 94 described previously. The arm is adjustable in length so that wafers stored in the transporter may be retrieved and placed on or picked up from wafer holder 62, also described previously, as is represented by the various positions of the arm shown in the figures. The arm is also shiftable vertically on shaft 188 in order to provide for the lifting or lowering of wafers carried by the fork.

Entry port 70 and transfer port 78 of the transporter are each selectively closed and opened by operation of valves 190 and 192, respectively. The valves are the same and only valve 190 is described with the understanding that the comments apply also to corresponding structure of valve 192. Valve 192 includes a block 194 having a passageway forming an extension of entry port 70. The block terminates in a vertical face 194a having an O-ring seal 196 which seals the connection when the two valve faces are placed against each other as shown in FIG. 22. Inside the passageway of the block is a gate 198 which is hingedly attached at 200 to the upper portion of the block. It is swingable between the open position shown and a closed position in which it sealingly seats against the margins of enclosure 48 which form the opening of entry port 70. When the two valves are placed face-to-face, the evacuating system evacuating enclosure 48 is operating. The gates are then opened, evacuating the space between the entry ports defined by the position of the doors. Transfer of wafers may then begin.

Addressing now transporter 72, cassette manipulator unit 82 includes a vertical shaft 196 which is movable vertically and rotatable. Mounted on top of the shaft is a table 198 on which cassettes 200 are placed for transferring wafers. The cassettes are placed in chamber 75 through entry door 76. Table 198 includes projections or guides 198a which are strategically located on the top surface of the table to confine the cassettes to selected positions, as shown. Through controls on transporter 72, the cassettes are positionable selectively one at a time adjacent transfer port 78. Further, because of the limited access provided by the transfer port, the cassettes are vertically positionable for making a selected wafer supported on a shelf of the cassette available for retrieving by robot 68 or for making an empty cassette shelf available for placement of an ion-implanted wafer from inside enclosure 48.

It will thus be appreciated that the present invention, as embodied in the above preferred and alternative embodiments, provides an ion implantation system which permits a high throughput of wafers while minimizing the potential particle build up from wafer and other device handling. From the various alternative configurations shown, it is apparent that, while a few particular embodiments have been shown and described, various modifications and equivalent structures may be made without varying from the spirit or scope of the claims.

What I claim is:

1. An ion implantation system for implanting ions in a target element comprising:

means for generating an implantation ion beam directed along a beam transmission path along an initial beam axis;

target support means for supporting a target element spaced from the initial beam axis during ion implantation;

beam diversion means disposed relative to said beam transmission path for diverting a beam generated by said generating means from the initial beam axis toward a beam impingement region of said target support means, said diversion means being mounted relative to said generating means for movement along the initial beam axis;

carrier means coupled to said diversion means and controllable for moving said diversion means along said initial beam axis, whereby the region of impingement on said target support means of a beam diverted by said diversion means is moved along said target support means in the beam impingement region along a first impingement line; and means for also moving the diverted beam across said target support means laterally of the first impingement line, whereby a target material supported on said target support means is scanned within the beam impingement region.

2. A system according to claim 1 further comprising enclosure means for enclosing the ion beam transmission path between said generating means and said target support means; and evacuating means for evacuating the enclosure defined by said enclosure means; said carrier means being disposed externally of said enclosure, and said diversion means being disposed internally of said enclosure.

3. A system according to claim 2 wherein said carrier means is coupled to said diversion means without a moveable mechanical member extending through said enclosure.

4. A system according to claim 3 wherein said carrier means includes electromagnetic means for applying a moving force externally of said enclosure means to said diverting means.

5. A system according to claim 4 wherein said diverting means is mounted for movement along a track generally parallel with the initial beam axis, said carrier means including a driven magnet fixedly mounted relative to said diverting means for movement with it, a driver magnet mounted externally of said enclosure adjacent said driven magnet, and drive means for moving said driver magnet relative to said enclosure for moving said driver magnet in a manner appropriate for moving said driven magnet and said diversion means along said track.

6. A system according to claim 5 wherein said driven and driver magnets are mounted spaced from said diversion means.

7. A system according to claim 1 wherein said generating means generates a beam along a generally horizontal initial beam axis and said support means comprises a plurality of target stations for supporting target elements, said stations being disposed about a hub rotatable for rotating said stations in a generally horizontal plane; and wherein said system further comprises means for rotating said hub.

8. A system according to claim 7 wherein said target stations include means for retaining target elements thereon exclusively by gravitational and centrifugal forces.

9. A system according to claim 7 wherein said target stations are in the form of mounting plates mountable in a fixed position relative to said hub for supporting said target elements in a plurality of concentric circles about said hub.

10. A system according to claim 9 wherein said mounting plates each are structured to support a plurality of radially adjacent target elements.

11. A system according to claim 7 wherein said target elements are have a generally planar target face and said target stations support the target elements with the faces disposed transversely of the axis of rotation of the target elements, and said diversion means directs the diverted beam at an angle transverse of the axis of hub rotation.

12. A system according to claim 11 wherein the axis of hub rotation is substantially vertical.

13. A system according to claim 11 wherein the diverted beam is directed substantially vertically downward.

14. A system according to claim 7 comprising a plurality of independently rotatable hubs, each for rotating a plurality of said target stations, said target stations associated with each hub and said diversion means and carrier means being structured to define a beam impingement region through which the target stations associated with both hubs pass.

15. A system according to claim 14 wherein said target stations associated with each hub are disposed to support target elements in a circle with the axis of hub rotation forming the center of the circle.

16. A system according to claim 15 wherein said hubs rotate about a common axis with the plane of rotation of the target stations associated with each hub are spaced apart, the diameter of the circle of rotation of the target stations closer to said diversion means being less than that of the diameter of the other circle of rotation.

17. A system according to claim 15 wherein the axes of hub rotation are parallel and spaced apart.

18. A system according to claim 17 wherein the diameters of the circles of rotation of the target stations are substantially equal.

19. A system according to claim 1 further comprising enclosure means for enclosing the ion beam transmission path between said generating means and said target support means, said enclosure means including a selectively openable entry port sized to allow a target element passage therethrough; evacuating means for evacuating the enclosure defined by said enclosure means; and robot means disposed in said enclosure adjacent said support means and having an arm extendable through said entry port for securing a target element and transferring it through said entry port between said target support means and the exterior of said enclosure.

20. A system according to claim 19 further comprising evacuatable target element transport means including a housing defining an evacuatable transport chamber for storing a target element and having a selectively openable transfer port sealingly engageable with said entry port, said robot means being operable to transfer a target element between said support means and said transport chamber when said entry and transfer ports are sealingly engaged.

21. A system according to claim 20 wherein a plurality of target elements are in the form of wafers stored in a cassette, said transport chamber being sized to contain such a cassette, said transport means including means for positioning, sequentially, selected ones of the wafers adjacent said transfer port for engagement by said robot means arm.

22. A system according to claim 21 wherein said positioning means includes cassette manipulation means for moving a cassette in said transport chamber relative to said transfer port in a manner positioning selected ones of wafers stored in the cassette for engagement by said robot means arm.

23. A system according to claim 22 wherein said cassette manipulation means includes a rack for supporting a plurality of cassettes and means for selectively positioning each cassette adjacent said transfer port.

24. A system according to claim 21 wherein said transport means housing includes a door sealingly closable for maintaining a reduced atmospheric pressure in said transport chamber relative to the exterior of said transport means, said door being sized to permit transfer of cassettes into and out of said transport chamber.

25. A system according to claim 20 wherein said transport means includes a frame for supporting said housing, said frame being mounted on rotatable wheels to permit manual transport relative to said entry port.

26. A system according to claim 1 further comprising beam shaping means interposed said generating means and said diversion means for producing a beam impinging said beam impingement region which is greatest in line with the initial beam axis.

27. A system according to claim 26 wherein said beam shaping means comprises a quadrupole.

28. An ion implantation system for implanting ions in a target element comprising:
    means for generating an implantation ion beam directed generally downward toward a target element impingement region,
    a target support wheel rotatable about a generally vertical axis for supporting target elements disposed in a generally horizontal plane, and
    means for varying the radial position the beam impinging the beam impingement region relative to said wheel; wherein said beam is initially directed along a generally horizontal initial beam axis, said system further including diversion means disposed relative to the beam transmission path for diverting a beam generated by the generating means from the initial beam axis toward a beam impingement region of said target support wheel; said varying means being coupled to said diversion means and controllable for moving said diversion means along said initial beam axis, said system further comprising enclosure means for enclosing the ion beam transmission path between said generating means and said target support means; and evacuating means for evacuating the enclosure defined by said enclosure means; said varying means being disposed externally of said enclosure and said diversion means being disposed internally of said enclosure, with the two being magnetically coupled so that no moveable mechanical member extends between said varying means and said diversion through said enclosure.

29. An ion implantation system for implanting ions in a target element comprising:
    means for generating an implantation ion beam directed generally downward toward a target element beam impingement region,
    a plurality of independently rotatable target support wheels, each for rotating a plurality of target element stations in a circular path, with the target stations of each wheel passing through said beam impingement region, said wheels rotating about a common axis with the plane of rotation of the target stations associated with each wheel are spaced apart, the diameter of the circle of rotation of the target stations closer to said diversion means being less than that of the diameter of the other circle of rotation,
    means for varying the radial position the beam impinging the beam impingement region relative to said wheel.

* * * * *